(12) United States Patent
Volianskii et al.

(10) Patent No.: US 12,132,497 B2
(45) Date of Patent: Oct. 29, 2024

(54) MULTIPATH D/A CONVERTER

(71) Applicant: Rohde & Schwarz GmbH & Co. KG, Munich (DE)

(72) Inventors: Mikhail Volianskii, Mering (DE); Marcus Bueche, Olching (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 121 days.

(21) Appl. No.: 17/856,226

(22) Filed: Jul. 1, 2022

(65) Prior Publication Data

US 2024/0007124 A1 Jan. 4, 2024

(51) Int. Cl.
*H03M 1/66* (2006.01)

(52) U.S. Cl.
CPC .................. *H03M 1/662* (2013.01)

(58) Field of Classification Search
CPC ........ H03M 1/66; H03M 1/662; H03M 1/742; H03M 3/50; H03M 1/0626; H03M 1/1009; H03M 1/1038; H03M 3/504; H03M 1/0614; H03M 1/0624
USPC .................. 341/141, 143, 144–154
See application file for complete search history.

(56) References Cited

U.S. PATENT DOCUMENTS

| | | | |
|---|---|---|---|
| 7,312,737 B2 | 12/2007 | Jungerman et al. | |
| 8,164,501 B2 | 4/2012 | Venes et al. | |
| 8,493,258 B1* | 7/2013 | Wyville | H03M 1/0614 341/143 |
| 9,065,472 B1* | 6/2015 | McCue | H03M 3/404 |
| 9,130,586 B1* | 9/2015 | Raz | H03M 1/662 |
| 9,397,677 B1* | 7/2016 | Abramzon | H03M 1/1033 |
| 9,577,657 B1* | 2/2017 | Clara | H03M 1/109 |
| 11,146,298 B2 | 10/2021 | Martin | |
| 11,658,670 B2* | 5/2023 | Wong | H03M 1/1004 375/295 |
| 2005/0116851 A1* | 6/2005 | Clara | H03M 1/0678 341/144 |
| 2011/0075780 A1* | 3/2011 | Petrovic | H03M 1/0614 375/355 |
| 2012/0176190 A1* | 7/2012 | Goodman | H03M 1/1052 327/551 |

(Continued)

FOREIGN PATENT DOCUMENTS

EP 2521268 B2 11/2012

*Primary Examiner* — Linh V Nguyen
(74) *Attorney, Agent, or Firm* — DITTHAVONG, STEINER & MLOTKOWSKI

(57) ABSTRACT

A multipath D/A converter is provided and has input terminals for a first and a second digital signal, and a signal combination unit D/A converting the digital signals supplied to the input terminals, and combining the generated analog signals. The signal combination unit includes a clock signal with a period having a first half period and a second half period. The signal combination unit combines the analog first and second signals by aggregating them with respective weighting coefficients. The signal combination unit has an output terminal for issuing an analog signal based on the aggregation. The signal combination unit applies a first set of weighting coefficients during the first half period of each period and a second set of weighting coefficients during said second half period of each period. The first set of weighting coefficients differs from the second set of weighting coefficients in at least one coefficient.

12 Claims, 2 Drawing Sheets

(56) References Cited

U.S. PATENT DOCUMENTS

2013/0207823 A1* 8/2013 Wyville ................ H03M 1/661
341/144
2016/0344401 A1* 11/2016 La Grou ............. H03M 1/1038
2017/0179936 A1* 6/2017 Chakraborty .......... H03K 5/131
2018/0159548 A1* 6/2018 Schmidt ................ H03M 1/662

* cited by examiner

MULTIPATH D/A CONVERTER

TECHNICAL FIELD

The invention is in the field of devices for combining a plurality of digital data signals, e.g. in the framework of multipath D/A converter.

BACKGROUND ART

Combination units for combining and also converting multiple digital paths are known for example from the area of multipath D/A converter.

EP 2 521 268 B1 discloses a data converter system that avoids interleave images and distortion products.

US 202021945A1 Discloses a signal generator device including a digital signal waveform generator to produce a digital signal waveform, a first frequency band signal path having a first frequency band filter to receive the digital signal waveform and to pass first frequency band components of the digital signal waveform, and a first digital-to-analog converter to receive the first frequency band components of the digital signal waveform and to produce a first frequency band analog signal, a second frequency band signal path having a second frequency band filter to receive the digital signal waveform and to pass second frequency band components of the digital signal waveform, a second digital-to-analog converter to receive the second frequency band components of the digital signal waveform and to produce a second frequency band analog signal, and a combining element to combine the first frequency band analog signal and the second frequency band analog signal to produce a wideband analog signal.

U.S. Pat. No. 7,312,737 B2 discloses a digital-to-analog converting system for producing an interleaved analog signal with enhanced bandwidth, wherein the system includes a first digital-to-analog converter for receiving a first digital data stream and converting the first digital data stream to a first analog signal and a second digital-to-analog converter for receiving a second digital data stream and converting the second digital data stream to a second analog signal.

U.S. Pat. No. 8,164,501 B2 discloses a transmitter and a communication system including a plurality of digital-to-analog converters. Furthermore, a plurality of clocks is provided, each being communicably coupled to a corresponding one of the digital-to-analog converters.

Furthermore, QMF-based D/A converters are known from Miao, Clements Digital Signal Processing and Statistical classification, ISBN 1-58053-135-0, see for example FIG. 8, 21.

SUMMARY OF THE INVENTION

The present invention targets at an efficiently designed approach for combining a plurality of digital data signal path.

One aspect relates to a multipath D/A converter, having:
input terminals for a least a first and a second digital signal (being supplied over respective signal paths), and
an analog signal combination unit combining the D/A converted digital signals supplied to the input terminals,
the signal combination unit being furthermore supplied with a clock signal with a period having a first part (e.g. half) period and a second part (e.g. half) period,
wherein the signal combination unit combines the analog first and second signals by aggregating them with respective weighting coefficients,
wherein the signal combination unit has an output terminal for issuing an analog signal based on the aggregation,
wherein the signal combination unit is designed to apply a first set of weighting coefficients during said first part period of each period and a second set of weighting coefficients during said second part period of each period, wherein the first set of weighting coefficients differs from said second set of weighting coefficients in at least one coefficient.

The first part period and the second part period typically are delimited by one raising and one falling edge of the clock signal.

The first set of weighting coefficients may differ from said second set of weighting coefficients at least in one sign of a coefficient, or in one sign of one coefficient only.

In one of the first and second half period of the clock signal the D/A converted first and the second digital signals may be added, wherein in the respectively other of first and second half period of the clock signal the D/A converted first and the second digital signal may be subtracted from each other.

The converter may comprise a digital filter for at least one of the first and the second digital signal.

The converter may comprise a first digital filter for first digital signal and a second digital filter for the second digital signal, wherein the first and the second digital filter have the same or different transfer functions.

Filter coefficients of the digital filter may be set are selected based on the weighting coefficients.

The converter may comprise respectively a down-sampling unit for the first and the second digital signal, respectively.

The sampling rate of the first and the second digital signal may be higher, preferably twice the frequency of the clock signal.

The converter may comprise a digital pre-emphasis unit for each of the first and second digital signal.

The pre-emphasis unit may be implemented by a digital filter.

The digital filter implementing a pre-emphasis unit may be part of a down-sampling unit.

Further a multipath D/A converter has:
input terminals for a least a first and a second digital signal, and
a signal combination unit arranged for D/A converting the at least first and second digital signal and then combining the resulting first and second analog signals,
the signal combination unit being furthermore supplied with a clock signal with a period having a first half period and a second half period,
wherein the signal combination unit combines the analog first and second signals by aggregating them with respective weighting coefficients,
wherein the signal combination unit has an output terminal for issuing an analog signal based on the aggregation,
wherein the signal combination unit is designed such that in one of the first and second half period of the clock signal the first and the second analog signals are added, wherein in the respectively other of first and second half period of the clock signal the first and the second analog signal are subtracted from each other.

A method for combining at least two digital data streams comprises the steps of:
provide a least a first and a second digital signal,
D/A converting these signals into first and second analog signals, and
combining the D/A converted signals with a clock signal with a period having a first part period and a second part period,
wherein the step of combining comprises the step of combining the first and second signals by aggregating them with respective weighting coefficients,
wherein a first set of weighting coefficients is applied during said first part period of each period, and a second set of weighting coefficients is applied during said second part period of each period, wherein the first set of weighting coefficients differs from said second set of weighting coefficients in at least one coefficient.

BRIEF DESCRIPTION OF THE DRAWINGS

Aspects of the invention will now be explained with reference to the figures of the enclosed drawings.

DETAILED DESCRIPTIONS OF EMBODIMENTS

Figure 1:
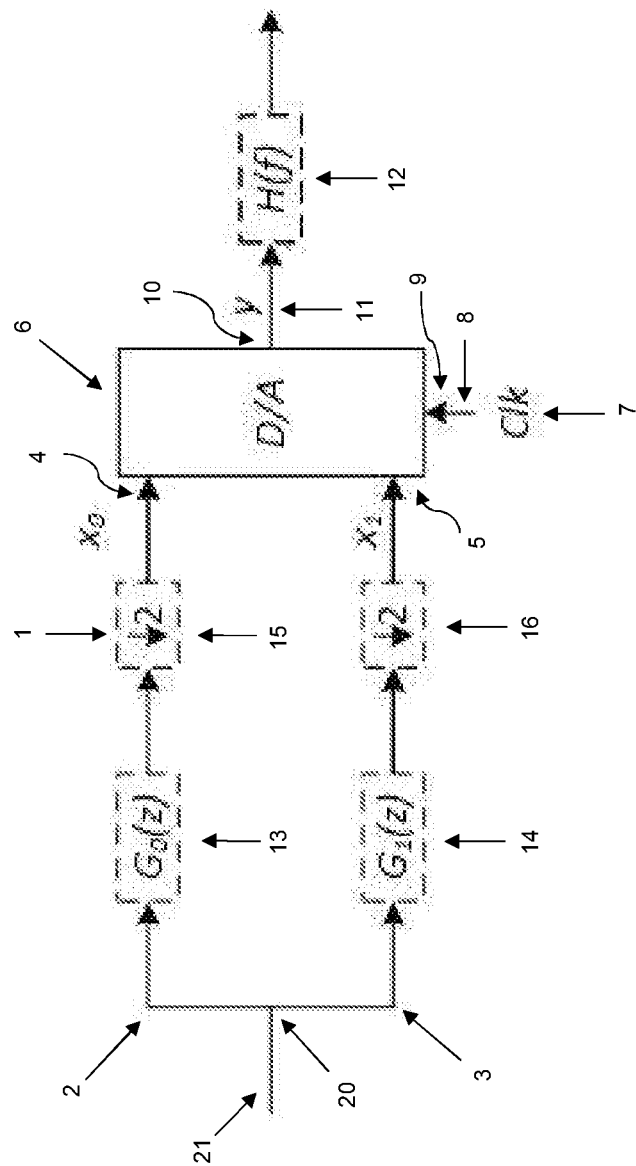
FIG. 1 shows schematically a signal-combination unit, such as for example a multipath D/A converter.

In FIG. 1 a device 1 for combining a plurality of digital data signal paths 2, 3 is shown. The plurality of digital signal paths 2, 3 are fed to respective input terminals of a signal combination unit, which may be part of a D/A converter 6. Thus, in the combination unit 6, the digital signals are respectively D/A converted and then combined as analog signals. Further, a clock unit 7 is provided supplying a clock signal 8 to a clock signal input port 9 of the combination unit 6.

In the example of a D/A converter 6, an output port 10 is provided for issuing an analog signal 11, which may optionally be subjected to further processing stages, such as for example an analog filter 12. As shown in FIG. 1, a plurality or all of the multiple digital signal paths 2, 3 may be provided with digital filters 13, 14, such as e.g. low pass filters.

Preferably, in each of the multiple digital signal paths 2, 3 down-sampling (resampling) units 15, 16 may be provided. Preferably, these are arranged downwards of the filter units 13, 14.

In an example, the resampling units 15, 16 reduce the original sampling rates of the signals 2, 3 to half of the original value (down-sampling via factor 2).

The clock signal 8 issued by the clock unit 7 is a periodic high/low signal with a defined period. The clock signal thus has two half periods, one of which starts with one of a rising or falling edge of the logical high state, and the respective other half period starts with the respective other of rising and falling edge of this digital high/low clock signal 8.

The combination unit 6 combines the supplied and D/A converted signals $X_0$ and $X_1$ by aggregating, wherein this combination comprises the step of aggregating $X_0$ and $X_1$ by applying respective weighting coefficients.

Thus, an aggregated value $y=A_1X_1+A_2X_2$ is produced by the combination unit.
While in the first half period, this formula $$y=A_1X_1+A_2X_2$$

is applied,
in the respective other half period of the clock signal 6, the formula $$y=A_3X_1+A_4X_2$$

is applied, under the condition, that:

$$A_1 \neq A_3 \text{ and/or}$$

$$A_2 \neq A_4.$$

$A_1$, $A_2$, $A_3$ and $A_4$ are positive or negative non-zero values. The difference between $A_1$ and $A_3$ and/or $A_2$ and $A_4$ may be not the absolute value, but just the sign. However, at least one difference may also be the absolute value. Most preferred these weighting coefficients are set to be at least partly orthogonal.

The first half period and the second half period are examples for a first part period and a second part period, respectively, of a clock signal. The first part period and the second part period typically are delimited by one raising and one falling edge of the clock signal. Thus, a first part (half) period or second part (half) period does not extend beyond a raising or falling edge of the clock signal.

Such edge may trigger the switching between the different sets of weighting coefficients. The current value of x1 or x2, respectively may be held, e.g. in a register, until the next one of a falling or raising edge of the clock signal is detected.

Therefore, $A_1$, $A_2$ may be respectively +1.
$A_3$ may be +1, while $A_4$ may be chosen as −1. This is one example of an at least partially if not completely orthogonal set of weighting coefficients.

Another example of the coefficient set is
1
0.5
0.75
0.175

This is an example where all coefficients have the same sign. The coefficients can be integer values, non-integer values or a mix thereof.

In other words, in one example in one of the half periods of the clock signal, the two signal values are added, while in the respective other half period the two signal values are subtracted from each other (in an analog manner).

Note that "addition" and "subtraction" does encompass the case where prior to the addition or subtraction the respective values of $X_1$, $X_2$ are waited by non-zero waiting coefficients which are not zero.

The digital filter units 13, 14 may implement pre-emphasis (pre-distortion) units.

The original digital signals 2, 3 may have a higher sampling rate then the rate of the clock signal 8 supplied by the clock unit 7. For example, the sampling rate of the original digital signals may be twice as high as the clock rate of the clock signal 8 supplied by the clock unit 7.

The original digital signals 2, 3 are preferably produced by splitting, via splitting dividing unit 20 a supplied single digital signal 21.

The digital filters 13, 14 are applying respective filter coefficients. These filter coefficients of the digital filter 13, 14 may be selected based on the weighting coefficients $A_1$, $A_2$, $A_3$, $A_4$ as applied by the combination unit 6.

The digital filter 13, 14, especially when implementing a respective pre-emphasis (pre-distortion) units may be part of the respective re-sampling unit 15, 16.

The filter coefficients may be set such that in each second sample the sign of the filter coefficient is inverted.

The pre-emphasis unit can be designed such that it applies a multiplication with a co-sign signal on to the supplied digital signals.

The above-explained combination unit thus preferably is an analog combination unit.

One single clock signal is applied to the analog combination unit, thus there is not a plurality of clock signals with e.g. phase shifts. The digital filter 13, 14 may be set such that one of the digital filters is a high-pass filter, while the respectively other is a low-pass filter. Alternatively, both digital filter 13, 14 may be low-pass filter.

Figure 2:
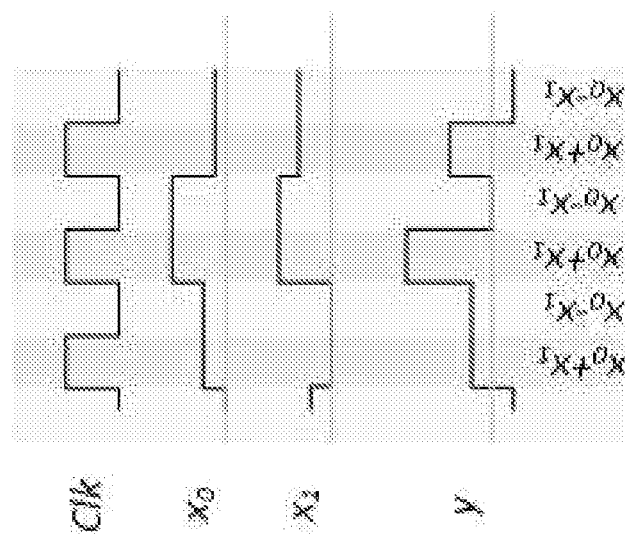
FIG. 2 shows signal diagrams according to an example of an operation of the device of FIG. 1.

Now turning to FIG. 2, a signal chart is shown indicating the digital high/low clock signal CLK, an example of a supplied first D/A converted signal $X_0$, an example for a supplied second D/A converted signal $X_1$ as well as the aggregated value y produced in the combination unit 6.

As can be seen, the waiting coefficients for the aggregation are set as follows:

$$A_1, A_3 = +1$$

$$A_2 = +1$$

$$A_4 = -1$$

This can be expressed, in this example, in that in a first half period of the clock signal, which is in this example the high-value time period of the clock signal, the two signals $X_0$, $X_1$ are added.

In this example, in the low period of the clock signal, the second signal $X_1$ is subtracted from the first signal $X_0$.

By applying different weighting coefficients in the combining (aggregation) step, the combination unit (and thus for example a D/A converter using such combination unit) effectively works as a combination unit (D/A converter) having twice the operation frequency of the supplied clock frequency.

The invention claimed is:

1. Multipath D/A converter, having:
   input terminals for a least a first and a second digital signal, and
   a signal combination unit arranged for D/A converting the first and second digital signal and then combining resulting analog signals supplied to the input terminals,
   the signal combination unit being furthermore supplied with a clock signal from a clock unit of the multipath D/A converter, the clock signal a period having a first part period and a second part period,
   wherein the combination unit combines the supplied first and second analog signals by aggregating them with respective weighting coefficients,
   wherein the combination unit has an output terminal for issuing an analog signal based on the aggregation,
   wherein the combination unit is designed to apply a first set of weighting coefficients during said first part period of each period and a second set of weighting coefficients during said second part period of each period,
   wherein the first set of weighting coefficients differs from said second set of weighting coefficients in at least one coefficient
   wherein in one of the first and the second part period of the clock signal the first and the second digital signals are added, wherein in the respectively other of first and second part period of the clock signal the first and the second digital signal are subtracted from each other.

2. The converter of claim 1,
   wherein the first set of weighting coefficients differs from said second set of weighting coefficients at least in one sign of a coefficient, or in one sign of one coefficient only.

3. The converter of claim 1,
   wherein the converter comprises a digital filter for at least one of the first and the second digital signal.

4. The converter of claim 3,
   wherein the converter comprises a first digital filter for first digital signal and a second digital filter for the second digital signal, wherein the first and the second digital filter have the same or different transfer functions.

5. The converter of claim 3,
   wherein filter coefficients of the digital filter are set are selected based on the weighting coefficients.

6. The converter of claim 1,
   comprising respectively a down-sampling unit for the first and the second digital signal, respectively.

7. The converter according to claim 6,
   wherein a sampling rate of the first and the second digital signal is higher, preferably twice the frequency of the clock signal.

8. The converter of claim 1,
   comprising a digital pre-emphasis unit for each of the first and second digital signal.

9. The converter according to claim 8,
   wherein the pre-emphasis unit is implemented by a digital filter.

10. The converter of claim 9,
    wherein the digital filter implementing a pre-emphasis unit is part of a down-sampling unit.

11. A multipath D/A converter, having:
    input terminals for a least a first and a second digital signal, and
    a signal combination unit D/A arranged for converting the at least first and second digital signal and then combining the resulting analog signals,
    the signal combination unit being furthermore supplied with a clock signal with a period having a first part period and a second part period,
    wherein the combination unit combines the supplied first and second analog signals by aggregating them with respective weighting coefficients,
    wherein the combination unit has an output terminal for issuing an analog signal based on the aggregation,
    wherein the combination unit is designed such that in one of the first and the second part period of the clock signal the first and the second signal are added, wherein in the respectively other of first and second part period of the clock signal the first and the second signal are subtracted from each other.

12. A method for combining at least two digital data streams, comprising the steps of:
    providing a least a first and a second digital signal,
    A/D converting the at least first and a second digital signal and
    combining the thus converted analog signals with a clock signal with a period having a first part period and a second half period,
    wherein the step of combining comprises the step of combining the first and second digital signals by aggregating them with respective weighting coefficients,
    wherein a first set of weighting coefficients is applied during said first part period of each period, and a second set of weighting coefficients is applied during said second part period of each period,
wherein the first set of weighting coefficients differs from said second set of weighting coefficients in at least one coefficient,
wherein in one of the first and the second part period of the clock signal the first and the second digital signals are added, wherein in the respectively other of first and second part period of the clock signal the first and the second digital signal are subtracted from each other.

* * * * *